(12) United States Patent
Seo et al.

(10) Patent No.: US 10,511,293 B2
(45) Date of Patent: Dec. 17, 2019

(54) SEMICONDUCTOR DEVICE

(71) Applicants: Samsung Electronics Co., Ltd., Suwon-si, Gyeonggi-do (KR); KOREA ADVANCED INSTITUTE OF SCIENCE AND TECHNOLOGY, Daejeon (KR)

(72) Inventors: Jae-Woo Seo, Seoul (KR); Youngsoo Shin, Daejeon (KR); Jinwook Jung, Daejeon (KR)

(73) Assignees: Samsung Electronics Co., Ltd., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/103,233

(22) Filed: Aug. 14, 2018

(65) Prior Publication Data

US 2019/0207593 A1 Jul. 4, 2019

(30) Foreign Application Priority Data

Jan. 3, 2018 (KR) ........................ 10-2018-0000818

(51) Int. Cl.
| | |
|---|---|
| *H03K 3/3562* | (2006.01) |
| *H03K 3/037* | (2006.01) |
| *G01R 31/317* | (2006.01) |
| *H01L 27/02* | (2006.01) |
| *G01R 31/3185* | (2006.01) |

(52) U.S. Cl.
CPC ... *H03K 3/35625* (2013.01); *G01R 31/31727* (2013.01); *G01R 31/318541* (2013.01); *H01L 27/0207* (2013.01); *H03K 3/0372* (2013.01)

(58) Field of Classification Search
CPC .. H03K 3/35625; H03K 19/003; H03K 19/20; H03K 3/012; H03K 5/19; H03K 3/0372; H03K 5/13; H03K 3/86
USPC .......................... 327/199, 200, 201, 202, 203
See application file for complete search history.

(56) References Cited

U.S. PATENT DOCUMENTS

| | | | |
|---|---|---|---|
| 7,408,393 B1 * | 8/2008 | Jain | ....................... H03K 3/0372 327/202 |
| 8,274,319 B2 | 9/2012 | Maeno | |
| 8,471,597 B2 | 6/2013 | Wang et al. | |
| 8,856,704 B2 | 10/2014 | Baeg | |
| 9,473,117 B2 | 10/2016 | Kim et al. | |
| 9,641,161 B1 | 5/2017 | Liu et al. | |

(Continued)

*Primary Examiner* — John W Poos
(74) *Attorney, Agent, or Firm* — Harness, Dickey & Pierce, P.L.C.

(57) ABSTRACT

A semiconductor device may include a clock driver including a first gate line, a second gate line, a third gate line and a fourth gate line each extending in a first direction, the first gate line and the second gate line each configured to receive a clock signal, and the third gate line and the fourth gate line each configured to receive an inverted clock signal; a master latch circuit overlapping the first gate line and the third gate line such that the master latch circuit receive the clock signal from the first gate line and receive the inverted clock signal from the third gate line; and a slave latch circuit overlapping the second gate line and the fourth gate line such that the slave latch circuit receives the clock signal from the second gate line, and receives the inverted clock signal from the fourth gate line.

19 Claims, 19 Drawing Sheets

(56) References Cited

U.S. PATENT DOCUMENTS

| | | | |
|---|---|---|---|
| 2004/0036517 A1* | 2/2004 | Ahn | H03K 3/012 |
| | | | 327/202 |
| 2009/0167394 A1 | 7/2009 | Bosshart | |
| 2017/0077910 A1 | 3/2017 | Kim et al. | |

* cited by examiner

10

20

SEMICONDUCTOR DEVICE

CROSS-REFERENCE TO RELATED APPLICATION

This application claims priority from Korean Patent Application No. 10-2018-0000818 filed on Jan. 3, 2018 in the Korean Intellectual Property Office, and all the benefits accruing therefrom under 35 U.S.C. 119, the contents of which in its entirety are herein incorporated by reference.

BACKGROUND

1. Field

Example embodiments relate to a semiconductor device.

2. Description of the Related Art

Semiconductor devices may be downsized and multi-functionalized in accordance with the demand of the electronic industry, and may be reduced in weight to reduce manufacturing costs. The semiconductor devices may be classified into a semiconductor memory device for storing logic data, a semiconductor logic device for performing an operational process of the logical data, a hybrid semiconductor device including a memory element and a logic element, and the like.

The semiconductor memory device may include flip-flop circuits and a latch. In order to design a semiconductor chip, there is an increasing demand for operating characteristics of a semiconductor memory device such as a flip-flop, and in particular, for a low area flip-flop and a latch circuit which may be arranged in a highly integrated circuit.

SUMMARY

Example embodiments of the present disclosure provide a semiconductor device including a low area flip-flop.

Example embodiments of the present disclosure are not limited to those mentioned above and other example embodiments which is not mentioned may be clearly understood by those skilled in the art from the description below.

According to example embodiments of the present disclosure, a semiconductor device includes a clock driver configured to output a clock signal and an inverted clock signal, the clock driver including a first gate line, a second gate line, a third gate line and a fourth gate line each extending in a first direction, the first gate line and the second gate line each configured to receive the clock signal, and the third gate line and the fourth gate line each configured to receive the inverted clock signal; a master latch circuit overlapping the first gate line and the third gate line such that the master latch circuit is configured to receive the clock signal from the first gate line and to receive the inverted clock signal from the third gate line; and a slave latch circuit overlapping the second gate line and the fourth gate line such that the slave latch circuit is configured to receive the clock signal from the second gate line, and to receive the inverted clock signal from the fourth gate line.

According to another example embodiments of the present disclosure, a semiconductor device includes a clock driver configured to output a clock signal and an inverted clock signal, the clock driver including a first gate line and a second gate line each extending in a first direction, the first gate line configured to receive the clock signal, and the second gate line configured to receive the inverted clock signal; a first flip-flop arranged sequentially with the clock driver in the first direction, the first flip-flop configured to receive the clock signal from the first gate line, and to receive the inverted clock signal from the second gate line; and a second flip-flop arranged sequentially with the clock driver in the first direction, the second flip-flop configured to receive the clock signal from the first gate line, and to receive the inverted clock signal from the second gate line.

According to another example embodiments of the present disclosure, a semiconductor device includes a clock driver configured to output a clock signal and an inverted clock signal; a first master latch circuit adjacent to the clock driver in a first direction; a first slave latch circuit adjacent to the clock driver in the first direction; a first gate line crossing the clock driver and the first master latch circuit in the first direction; and a second gate line crossing the clock driver and the first slave latch circuit in the first direction.

According to another example embodiments of the present disclosure, a semiconductor device includes a clock driver configured to output a clock signal and an inverted clock signal; a first flip-flop on a first side of the clock driver such that the first flip-flop is adjacent to the clock driver in a first direction; a second flip-flop on a second side of the clock driver such that the second flip-flop is adjacent to the clock driver in the first direction; a first gate line crossing the clock driver and the first flip-flop in the first direction, and a second gate line crossing the clock driver and the second flip-flop in the first direction.

BRIEF DESCRIPTION OF THE DRAWINGS

The above and other aspects and features of the present disclosure will become more apparent by describing in detail some example embodiments thereof with reference to the attached drawings, in which.

DETAILED DESCRIPTION

Figure 1:
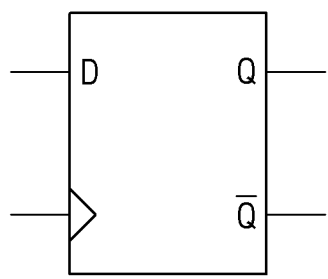
FIG. 1 is an example block diagram of a flip-flop included in a semiconductor device according to some example embodiments of the present disclosure.

FIG. 1 is an example block diagram of the flip-flop included in the semiconductor device according to some example embodiments of the present disclosure.

Referring to FIG. 1, the semiconductor device according to some example embodiments of the present disclosure may include a D-flip flop 10 that temporarily stores an input data (D) and outputs the stored data in the form of an output data (Q) by an input clock signal.

In the flip-flop 10 illustrated in FIG. 1, the input data (D) may include 1 bit data. Also, an output data (Q) which is output from the flip-flop 10 may include 1 bit data.

The form of the flip-flop 10 illustrated in FIG. 1 is an example, and the flip-flop 10 may further receive, for example, a scan enable signal, a reset signal, a set signal and the like from the outside.

Figure 2:
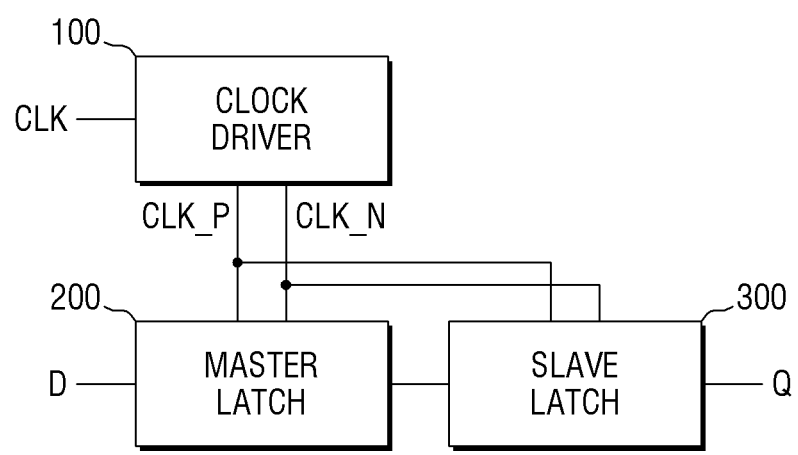
FIG. 2 is a block diagram for explaining the flip-flop of FIG. 1.

FIG. 2 is an example block diagram for explaining the flip-flop of FIG. 1.

Referring to FIG. 2, the flip-flop 10 may include a clock driver circuit 100, a master latch circuit 200, and a slave latch circuit 300.

The clock driver circuit 100 receives a clock signal (CLK) from the outside and may provide the clock signal to the master latch circuit 200 and the slave latch circuit 300. Specifically, the clock driver circuit 100 may output an output signal (CLK_N) obtained by inverting the provided input clock signal (CLK), and a clock signal (CLK_P) obtained by inverting the clock signal (CLK_N).

The signal (CLK_P) may have the same phase as the input clock signal (CLK) that is provided from the outside. Therefore, hereinafter, the signal (CLK_P) will be referred to as a clock signal, and the signal (CLK_N) will be referred to as an inverted clock signal.

The specific components included in the clock driver circuit 100 will be described in more detail later.

The master latch circuit 200 and the slave latch circuit 300 may receive the input of the data signal (D) from the outside and may provide the data signal in the form of the output data (Q). The master latch circuit 200 and the slave latch circuit 300 temporarily store the provided data signal (D) and provide the data signal to the outside in the form of output data (Q) by the clock signal (CLK). Therefore, the contents of the output data (Q) and the data signal (D) are the same.

The specific constituent elements included in the master latch circuit 200 and the slave latch circuit 300 will be explained in more detail below.

Figure 3:
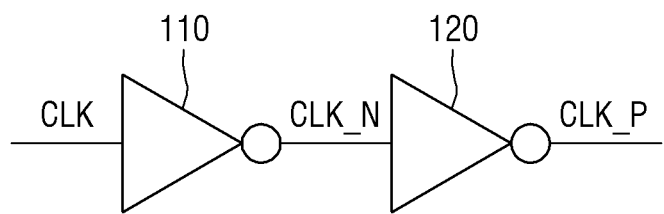
FIG. 3 is a circuit diagram for explaining a clock driver circuit of FIG. 2.

FIG. 3 is an example circuit diagram for explaining the clock driver circuit of FIG. 2.

Referring to FIG. 3, the clock driver circuit (100 of FIG. 2) may include a first inverter 110 and a second inverter 120.

The first inverter 110 may receive the input clock signal (CLK) and may invert the input clock signal to generate an inverted clock signal (CLK_N). Likewise, the second inverter 120 may receive the inverted clock signal (CLK_N) and may invert the inverted clock signal to generate the clock signal (CLK_P).

However, example embodiments are not limited to the clock driver circuit illustrated in FIG. 3. For example, in some other example embodiments of the present disclosure, the clock driver circuit 100 may include one inverter. In this case, the clock driver circuit 100 may pass the input clock signal (CLK) to the clock signal (CLK_P).

Figure 4:
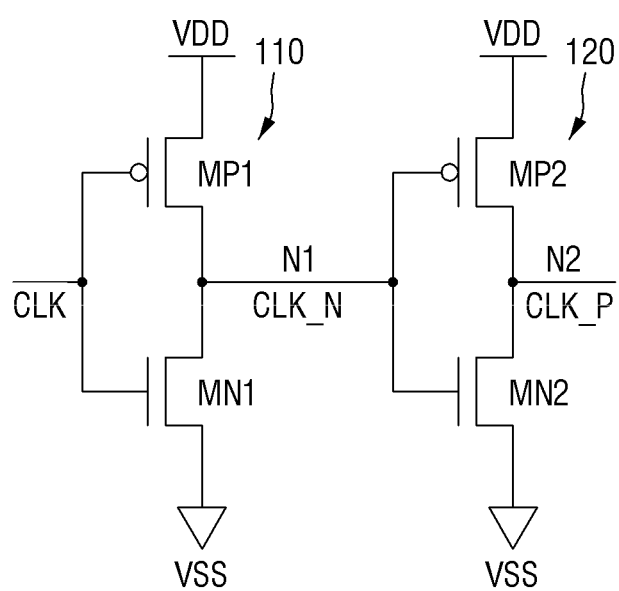
FIG. 4 is a circuit diagram for explaining the clock driver circuit of FIG. 2.

FIG. 4 is a circuit diagram for explaining the clock driver circuit of FIG. 2.

Referring to FIG. 4, the first inverter 110 may include a first NMOS transistor MN1 and a first PMOS transistor MP1, and the second inverter 120 may include a second NMOS transistor MN2 and a second PMOS transistor MP2.

The first inverter 110 may be connected to the second inverter 120 via the node N1. As illustrated in FIG. 4, the first inverter 110 may provide the inverted clock signal (CLK_N) to the node N1.

The second inverter 120 may provide the clock signal (CLK_P) to the node N2.

Figure 5A:
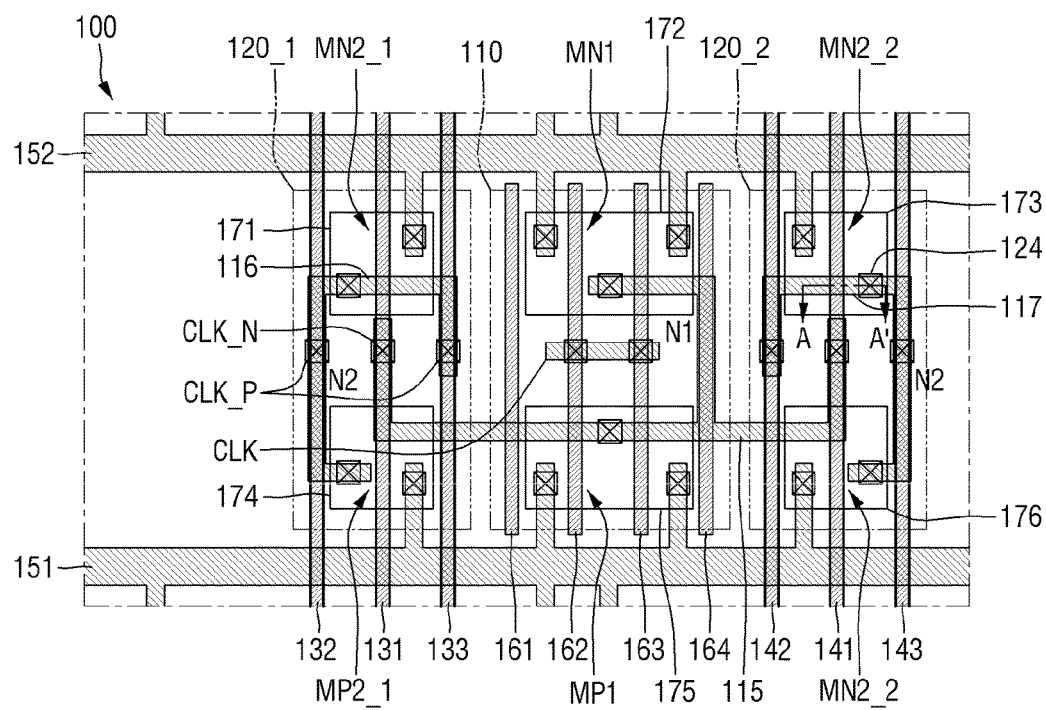
FIG. 5A is a layout diagram for explaining the clock driver circuit of FIG. 4.

FIG. 5A is an example layout diagram for explaining the clock driver circuit of FIG. 4.

Referring to FIG. 5A, the clock driver circuit 100 may include a first inverter 110 and second inverters (120_1, 120_2) which are disposed between a first power rail 151 and a second power rail 152.

The first power rail 151 and the second power rail 152 may extend long in a first direction. In this specification, the first direction will be described as meaning a left-right direction of FIG. 5A.

For example, the first power rail 151 may be a power supply voltage (VDD) rail, and the second power rail 152 may be a ground voltage (VSS) rail, but are not limited thereto. Hereinafter, it is assumed that the first power rail 151 provides the power supply voltage (VDD) and the second power rail 152 provides the ground voltage (VSS).

Active regions (171 to 176) may be defined on the substrate. The first to third active regions (171 to 173) may extend in the first direction, and may be disposed to be spaced apart from each other in the first direction. In some example embodiments, the first to third active region (171 to 173) may be regions including N-type impurities. Therefore, an NMOS transistor may be formed on the first active region to the third active region (171 to 173).

The fourth to sixth active regions (174 to 176) may extend in the first direction and may be disposed to be paced apart from each other in the first direction. In some example embodiments, the fourth to sixth active regions (174 to 176) may be regions including P-type impurities. Therefore, a PMOS transistor may be formed on the fourth to sixth active regions (174 to 176).

The first active region 171 and the fourth active region 174 may be spaced apart from each other in the second direction. In the description, the second direction will be described as the vertical direction of FIG. 5A. Therefore, the second direction may be orthogonal to the first direction.

As illustrated in FIG. 5A, the second active region 172 and the fifth active region 175 may be spaced apart from each other in the second direction, and the third active region 173 and the sixth active region 176 may be spaced apart from each other in the second direction.

The first inverter 110 may include gate lines (161 to 164). Among the gate lines, the gate lines (161, 164) which do not overlap the active regions (172, 175) may be dummy gate lines. The gate lines (161 to 164) may extend long in the second direction and may be disposed to be spaced apart from each other in the first direction. The gate lines (161 to 164) may be formed so as not to overlap the power rails (151, 152).

As illustrated in FIG. 5A, the gate lines (162, 163) overlap the second active region 172 to form a first NMOS transistor MN1. The gate lines (162, 163) overlap the fifth active region 175 to form a first PMOS transistor MP1. The first NMOS transistor MN1 and the first PMOS transistor MP1 may be aligned in the second direction.

The first inverter 110 may receive the input clock signal (CLK) via the gate lines (162, 163) and output the input clock signal to the node N1.

The second inverter (120_1, 120_2) may be included side by side with the first inverter 110. The second inverter may include a first sub-inverter 120_1 and a second sub inverter 120_2. As described above, the second inverter 120 receives the inverted clock signal (CLK_N) and inverts the inverted clock signal to form the clock signal (CLK_P). The circuit operations of the first sub inverter 120_1 and the second sub inverter 120_2 are the same. In some example embodiments, the first sub inverter 120_1 and the second sub inverter 120_2 may be formed symmetrically around the first inverter 110.

The first sub inverter 120_1 may include gate lines (131 to 133). The gate lines (131 to 133) may extend long in the second direction and may be disposed to be spaced apart from each other in the first direction.

The gate line 131 may overlap the fourth active region 174 to form a second PMOS transistor MP2_1. The gate line 131 may overlap the first active region 171 to form a second NPMOS transistor MN2_1.

An inverted clock signal (CLK_N) generated by the first inverter 110 may be applied to the gate line 131. The gate line 131 may overlap the power rails (151, 152). More precisely, the gate line 131 may continuously extend in the second direction across the power rails (151, 152).

The gate lines (132, 133) may be disposed on both sides of the gate line 131. A clock signal (CLK_P) formed by the second inverter 120_1 may be applied to the gate lines (132, 133). The gate lines (132, 133) may overlap the power rails (151, 152). More precisely, the gate lines (132, 133) may continuously extend in the second direction across the power rails (151, 152).

That is, the gate lines (131 to 133) may extend to the outside of the clock driver 100 circuit. The semiconductor device according to some example embodiments of the present disclosure includes a clock driver 100 which transmits a signal via the gate lines (131 to 133).

Specifically, the clock driver 100 may provide the inverted clock signal (CLK_N) to the outside via the gate line 131. Furthermore, the clock driver 100 may provide the clock signal (CLK_P) to the outside via the gate lines (132, 133). Therefore, the clock driver 100 provides the clock signal (CLK_P) and the inverted clock signal (CLK_N) to the circuits arranged side by side in the second direction via the gate lines (131 to 133).

Similarly, the sub-inverter 120_2 identical to the sub inverter 120_1 may also transmit the signal through the gate lines (141 to 143).

The clock driver 100 may provide the inverted clock signal (CLK_N) to the outside via the gate line 141. Further, the clock driver 100 may provide the clock signal (CLK_P) to the outside via the gate lines (142, 143). Therefore, the clock driver 100 provides the clock signal (CLK_P) and the inverted clock signal (CLK_N) to the circuits arranged side by side in the second direction via the gate lines (141 to 143).

In FIG. 5A, the clock driver 100 is illustrated to output the clock signal (CLK_P) and the inverted clock signal (CLK_N) to the outside via a total of six gate lines (131 to 133, and 141 to 143). However, example embodiments are not limited thereto. The clock driver 100 may output the clock signal (CLK_P) and the inverted clock signal (CLK_N) through only one gate line. The number of gate lines extending from the clock driver 100 may vary depending on the configurations of a master latch 200 and a slave latch 300 which will be described below.

Figure 5B:
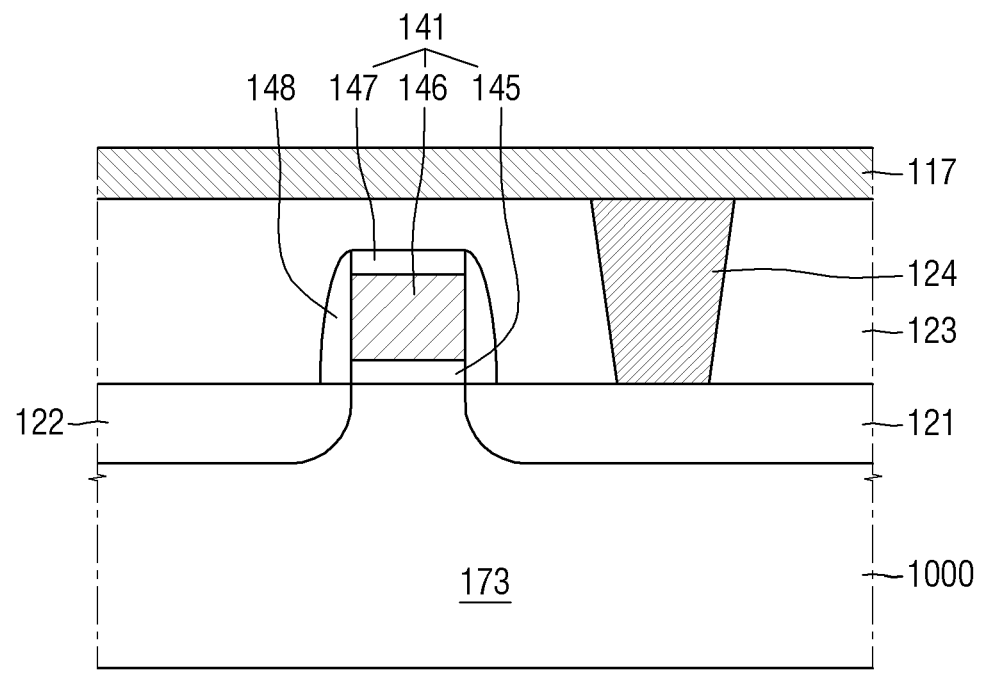
FIG. 5B is a cross-sectional view taken along line A-A' of FIG. 5A.

FIG. 5B is a cross-sectional view taken along line A-A' of FIG. 5A.

Referring to FIG. 5B, the semiconductor device according to some example embodiments of the present disclosure may include a substrate 1000, a drain region 121, a source region 122, a gate line 141, and the like.

The substrate 1000 may be, for example, a silicon substrate, a gallium arsenide substrate, a silicon germanium substrate, a ceramic substrate, a quartz substrate, a display glass substrate, or the like, and may be an SOI (Silicon on Insulator) substrate. In the semiconductor element according to an example embodiment of the present disclosure, the substrate 1000 is described as a silicon substrate as an example.

An active region 173 is defined in the substrate 1000, and the drain region 121 and the source region 122 may be formed in the active region 173. The drain region 121 and the source region 122 may be formed on both sides of the gate line 141.

In the drawings, only a configuration in which the drain region 121 or the source region 122 is formed in the substrate 1000 is illustrated, but the disclosure is not limited thereto. In some example embodiments of the present disclosure, the upper surfaces of the drain region 121 and the source region 122 may be formed to be higher than the upper surface of the substrate 1000, for example, through an epitaxial growth process.

The gate line 141 may include a gate insulating film 145, a gate electrode 146, and a hard mask film 147. In some example embodiments of the present disclosure, the gate line 141 may be formed, but is not limited to, through a gate first process, as illustrated in the drawings. However, example embodiments are not limited thereto. For example, the gate line 141 may also be formed via a replacement process or a gate last process.

The gate electrode 146 may be formed to fill a trench defined by the gate spacer 148 and the gate insulating film 145. The gate electrode 146 may include, for example, a substance having high conductivity. In some example embodiments of the present disclosure, the gate electrode 146 may include, but is not limited to, at least one of polycrystalline silicon (poly Si), amorphous silicon (a-Si), titanium (Ti), titanium nitride (TiN), and tungsten nitride (WN).

The gate insulating film 145 may be formed between the gate electrode 146 and the substrate 1000. The gate insulating film 145 may include a dielectric material having a higher dielectric constant than, for example, silicon oxide, silicon oxynitride, silicon nitride, and silicon oxide.

The gate spacer 148 may be formed on sidewalls of the gate electrode 146 and the gate insulating film 145. The gate spacer 148 may include, but is not limited to, for example, silicon nitride, silicon oxynitride, silicon oxide, or the like.

The hard mask film 147 may be formed on the gate electrode 146. The hard mask film 147 may include, but is not limited to, for example, silicon nitride, silicon oxynitride, silicon oxide, and the like.

A contact 124 may be formed on the drain region 121. The contact 124 may electrically connect the metal 117 and the drain region 121. The contact 124 may be formed in the interlayer insulating film 123. The contact 124 may include, for example, a conductive substance. In some example embodiments of the present disclosure, such a conductive substance may include at least one of polycrystalline silicon, a metal silicide compound, a conductive metal nitride, and a metal, but the present disclosure is not limited thereto.

The metal 117 may be formed on the interlayer insulating film 123. As illustrated in FIG. 5B, the metal 117 may be arranged on a M1 layer, but example embodiments are not limited thereto. The metal 117 may include, for example, a conductive substance. Examples of these conductive substances include doped polysilicon, titanium nitride (TiN), tantalum nitride (TaN), tungsten nitride (WN), titanium (Ti), tantalum (Ta), tungsten (W) and the like. However, example embodiments are not limited thereto.

As illustrated in FIG. 5A, the metal 117 may be electrically connected to the gate line 143 through a via. The voltage of the output node N2 of the inverter 120_2 may be applied to the metal 117.

Figure 5C:
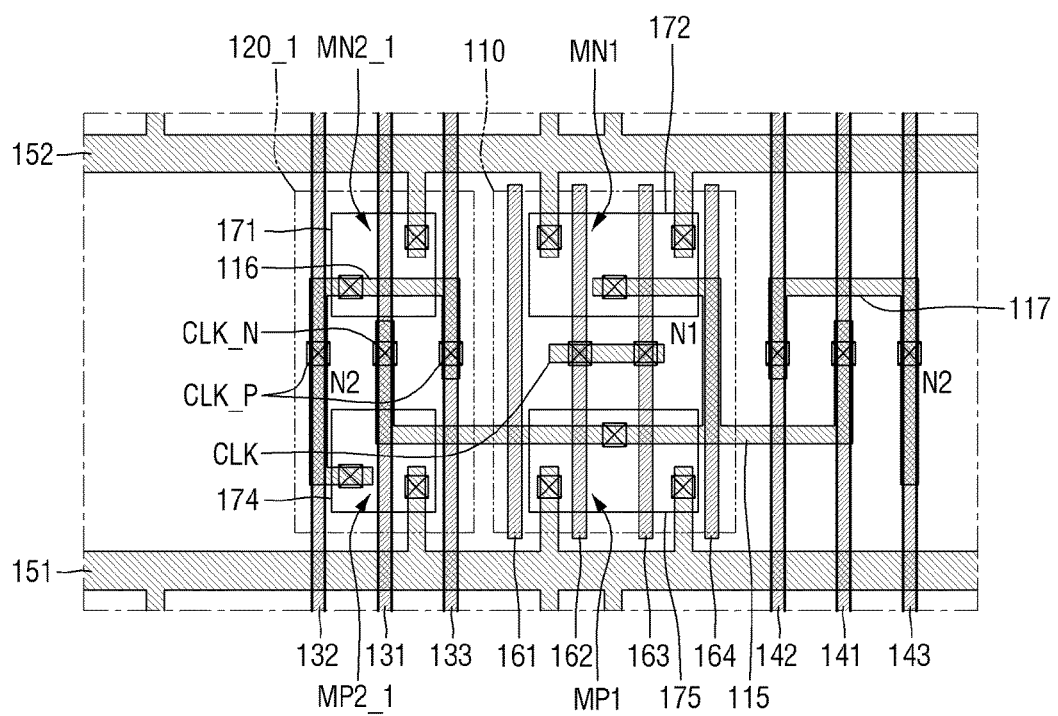
FIG. 5C is a layout diagram for explaining the clock driver circuit of FIG. 4.

FIG. 5C is a layout diagram for explaining the clock driver circuit of FIG. 4.

Referring to FIG. 5C, the semiconductor device according to some example embodiments of the present disclosure may include a flip-flop circuit having a layout different from that illustrated in FIG. 5A.

Specifically, the clock driver 100 may not include a third active region 173 and a sixth active region 176, unlike the layout illustrated in FIG. 5A. The gate line 141 is electrically connected to the gate line 131, and an inverted clock signal (CLK_N) may be applied thereto. The gate lines (142, 143) are electrically connected to the gate lines (132, 133), respectively, and the clock signal (CLK_P) may be applied thereto.

Figure 6:
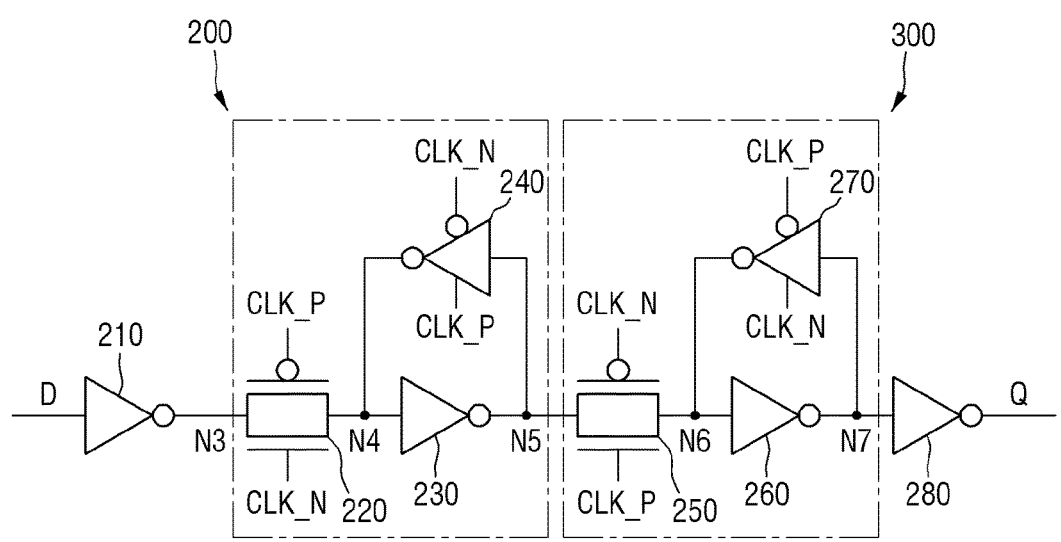
FIG. 6 is an example circuit diagram of a flip-flop included in the semiconductor device according to some example embodiments of the present disclosure.

FIG. 6 is an example circuit diagram of a flip-flop included in the semiconductor device according to some example embodiments of the present disclosure.

Referring to FIG. 6, the flip-flop may include a master latch circuit 200 and a slave latch circuit 300.

The master latch 200 may include a first transmission gate 220, a first inverter 230, a first master latch tri-state inverter 240.

The master latch 200 may store the data signal (D) which is input via the node N3, and may output the data signal (D) to the node N5. Specifically, the master latch 200 may output the input data signal (D) on the basis of the clock signal (CLK_P) and the inverted clock signal (CLK_N).

Specifically, the first transmission gate 220 receives the data signal (D) inverted by the inverter 210 from the node N3. When the clock signal (CLK_P) is a logic low (L) and the inverted clock signal (CLK_N) is a logic high (H), the first transmission gate 220 may invert the input and may output the input to the node N4.

The first transmission gate 220 may share the output terminal with the first master latch tri-state inverter 240. The first master latch tri-state inverter 240 may invert the output signal provided from the first inverter 230 and may output the output signal to the node N4.

Specifically, when the clock signal (CLK_P) is a logic high (H) and the inverted clock signal (CLK_N) is a logic low (L), the first master latch tri-state inverter 240 may invert the signal which is output to the node N5 by the first inverter 230, and may output the inverted signal to the node N4. Conversely, when the clock signal (CLK_P) is a logic low (L) and the inverted clock signal (CLK_N) is a logic high (H), the first master latch tri-state inverter 240 does not output the signal to the node N4.

The slave latch 200 may include a second transmission gate 250, a second inverter 260, and a second slave latch tri-state inverter 270. The slave latch 200 may operate similarly to the master latch 100 circuit described above.

Specifically, the slave latch 200 may store the data signal (D) which is input via the node N5, and may output the data signal (D) to the node N7. Specifically, the slave latch 200 may output the input data signal (D) to the node N6 on the basis of the clock signal (CLK_P) and the inverted clock signal (CLK_N). The data signal which is output to the node N6 is inverted by the second inverter 260 and is output to the node N7.

Specifically, the second transmission gate 250 receives the data signal (D) from the node N5. When the clock signal (CLK_P) is a logic high (H) and the inverted clock signal (CLK_N) is a logic low (L), the second transmission gate 250 may output the input to the node N6.

The output terminal of the second transmission gate 250 may share the output terminal with the first slave latch tri-state inverter 270. The first slave latch tri-state inverter 270 inverts the output signal provided from the second inverter 260 and may output the inverted signal to the node N6.

Specifically, when the clock signal (CLK_P) is a logic low (L) and the inverted clock signal (CLK_N) is a logic high (H), the first slave latch tri-state inverter 270 may invert the signal, which is output to the node N7 by the second inverter 260, and may output the inverted signal to the node N6. On the contrary, when the clock signal (CLK_P) is a logic low (L) and the inverted clock signal (CLK_N) is a logic high (H), the first slave latch tri-state inverter 270 may block the second inverter 260 from the node N6.

Figure 7A:
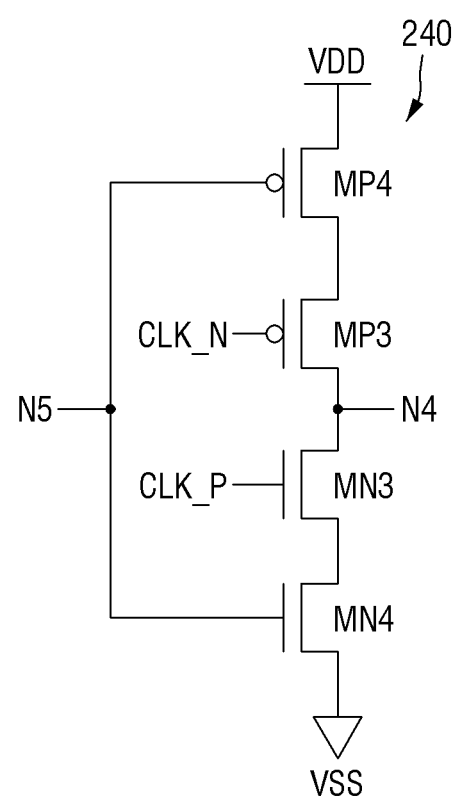
FIGS. 7A and 7B are circuit diagrams of tri-state inverters included in the flip-flop circuit of FIG. 6.
Figure 7B:
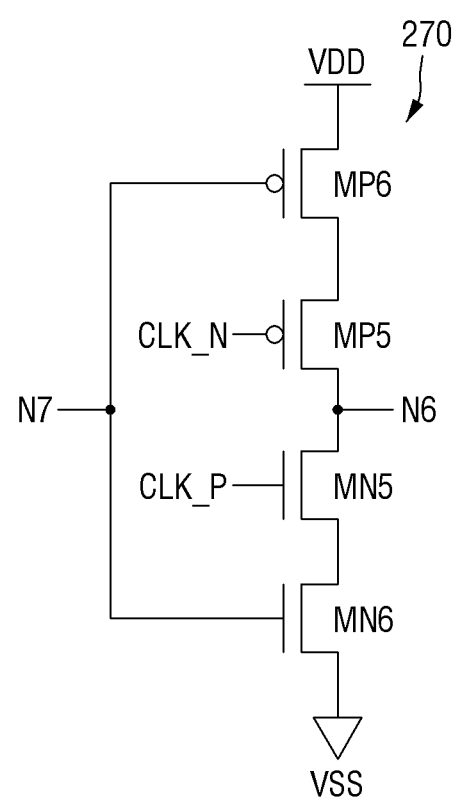

FIGS. 7A and 7B are circuit diagrams of tri-state inverters included in the flip-flop circuit of FIG. 6.

First, referring to FIG. 7A, the first master latch tri-state inverter 240 may include third to fourth NMOS transistors (MN3, MN4) and third to fourth PMOS transistors (MP3, MP4). The aforementioned transistors may be arranged in series between the power supply voltage (VDD) and the ground voltage (VSS).

Since the specific operation of the first master latch tri-state inverter 240 has been described above, the description thereof will not be provided. That is, output of the data signal (D), which is input to the node N5, to the node N4 may be controlled, by the third PMOS transistor MP3 and the third NMOS transistor MN3 which are gated through the clock signal (CLK_P) or the inverted clock signal (CLK_N).

Referring to FIG. 7B, the first slave latch tri-state inverter 270 may include fifth to sixth NMOS transistors (MN5, MN6), and fifth to sixth PMOS transistors (MP5, MP6). The transistors may be arranged in series between the power supply voltage (VDD) and the ground voltage (VSS).

The configuration of the first slave latch tri-state inverter 270 is the same as that described above. That is, output of the data signal (D), which is input to the node N7, to the node N6 may be controlled, by the fifth NMOS transistor MN5 and the fifth PMOS transistor MP5 which are gated through the clock signal (CLK_P) or the inverted clock signal (CLK_N), respectively.

Figure 8A:
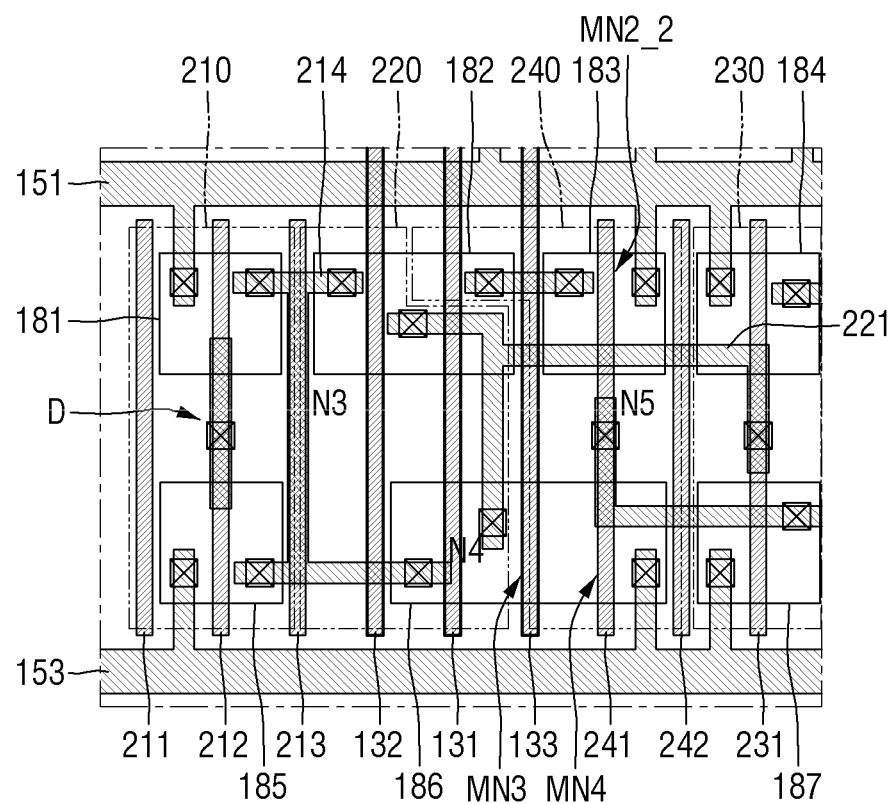
FIGS. 8A and 8B are layout diagrams for explaining the flip-flop circuit of FIG. 6.
Figure 8B:
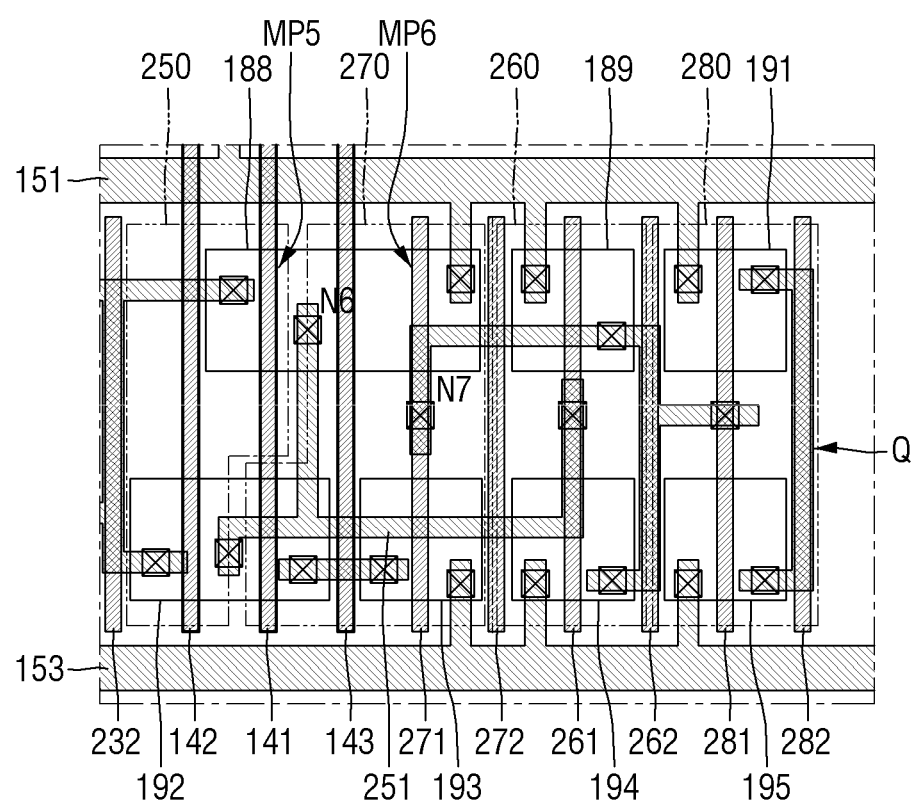

FIGS. 8A and 8B are layout diagrams for explaining the flip-flop circuit of FIG. 6.

First, referring to FIG. 8A, the layouts of the inverter 210 and the master latch circuit 200 are illustrated. Specifically, the layouts of the inverter 210, the first transmission gate 220, the inverter 230, and the first master latch tri-state inverter 240 are illustrated.

As described above, the clock signal (CLK_P) and the inverted clock signal (CLK_N) are applied to the gate lines (131 to 133). That is, the clock signal (CLK_P) and the inverted clock signal (CLK_N) are provided to the master latch 200 from the clock driver 100, by the gate lines (131 to 133) extending in the second direction.

The flip-flop may include active regions (181 to 187). The gate lines illustrated in FIG. 8A may overlap the respective active regions (181 to 187) to form transistors.

For example, the gate line 131 may overlap the active region 182 to form the third PMOS transistor MP3, and may overlap the active region 186 to form the third NMOS transistor MN3. The third PMOS transistor MP3 and the third NMOS transistor MN3 may be electrically connected to the gate 231 of the inverter 230 through the node N4.

The power supply voltage (VDD) may be provided to the third PMOS transistor MP3 via the first power rail 151. The ground voltage (VSS) may be provided to the third NMOS transistor MN3 via the third power rail 153.

The gate line 241 may overlap the active region 183 to form a fourth PMOS transistor MP4 and may overlap the active region 186 to form a fourth NMOS transistor MN4.

The gate lines (211, 213, and 242) which do not overlap the active region may be dummy gates.

Referring to FIG. 8B, the layout of the slave latch circuit 300 is illustrated. Specifically, the layouts of the second transmission gate 250, the inverter 260, the first slave latch tri-state inverter 270 and the inverter 280 are illustrated.

The slave latch circuit 300 may be sequentially arranged with the master latch circuit 200 in the first direction. That is, the slave latch circuit 300 may be sequentially arranged in the first direction, while sharing the first power rail 151 and the third power rail 153 with the master latch circuit 200.

The flip-flop may include active regions (188 to 195). The gate lines illustrated in FIG. 8B may overlap the respective active regions (188 to 195) to form transistors.

For example, the gate line 141 may overlap the active region 188 to form a fifth PMOS transistor MP5. The inverted clock signal (CLK_N) is applied to the gate line 141 as described above. The clock signal (CLK_P) is applied to gate lines (142, 143) arranged on both sides of the gate line 141.

The gate line 271 may overlap the active region 188 to form a sixth PMOS transistor MP6.

As a result, the clock signal (CLK_P) and the inverted clock signal (CLK_N) are provided to the master latch circuit 200 and the slave latch circuit 300 from the clock driver 100, by the gate lines (131 to 133, and 141 to 143) extending long in the second direction.

In the semiconductor device according to some example embodiments of the present disclosure, since the clock signal (CLK_P) and the inverted clock signal (CLK_N) are transmitted to the master latch circuit 200 and the slave latch circuit 300 through the gate lines (131 to 133, and 141 to 143), the clock signal (CLK_P) and the inverted clock signal (CLK_N) may not receive the master latch circuit 300 and the slave latch circuit 300 using another metal.

For example, the clock signal (CLK_P) and the inverted clock signal (CLK_N) may be transmitted to the master latch circuit CLK_P and the slave latch circuit 300 through a M1 layer or a M2 layer located above the M1 layer and connected to the M1 layer 200 through the via. However, since both the master latch circuit 200 and the slave latch circuit 300 receive the clock signal (CLK_P) and the inverted clock signal (CLK_N) from, for example, intra-cell wiring, the connection complexity of the metal in the layout may increase. As a result, problems such as an increase in difficulty of manufacturing or an increase in circuit area may occur.

Therefore, in one or more example embodiments, the clock signal (CLK_P) and the inverted clock signal (CLK_N) are provided to the master latch circuit 200 and the slave latch circuit 300 included in the semiconductor device from the clock driver 100, by the gate lines (131 to 133, and 141 to 143) extending in the second direction. As a result, due to, for example, inter-cell wiring resulting in the clock driver 100 being in a different row from the master latch and slave latch, it is possible to reduce the number of connections of the M1 layer or the M2 layer, and to reduce (or, alternatively, prevent) problems such as an increase in manufacturing difficulty or an increase in the circuit area.

Figure 9:
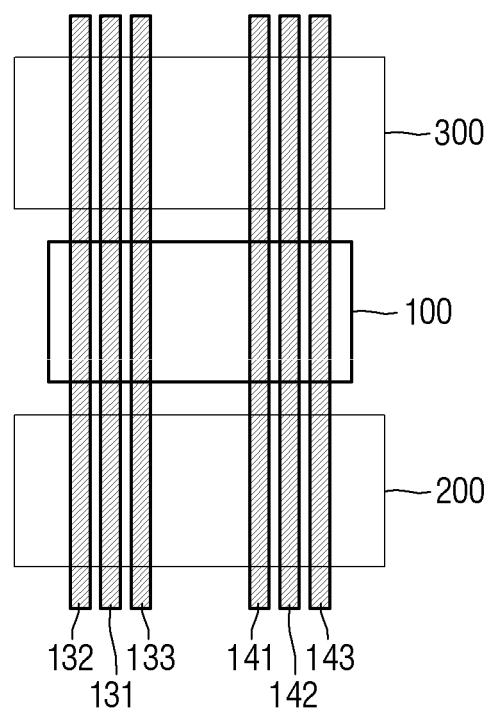
FIG. 9 is an example layout diagram of the flip-flop included in the semiconductor device according to some example embodiments of the present disclosure.

FIG. 9 is an example layout diagram of the flip-flop included in the semiconductor device according to some example embodiments of the present disclosure.

Referring to FIG. 9, the semiconductor device according to some example embodiments of the present disclosure may include a clock driver circuit 100, a master latch circuit 200, and a slave latch circuit 300 arranged in a second direction, that is, a vertical direction of FIG. 9.

In FIG. 9, the slave latch circuit 300, the clock driver circuit 100, and the master latch circuit 200 are illustrated as being arranged in the second direction sequentially from the top, but the disclosure is not limited thereto. For example, the clock driver circuit 100, the master latch circuit 200, and the slave latch circuit 300 may be sequentially arranged in the second direction in this order. That is, when the three circuits are arranged in the second direction, the arrangement order thereof is not limited.

The gate lines (131 to 133, and 141 to 143) may be arranged to traverse the clock driver circuit 100, the master latch circuit 200 and the slave latch circuit 300 in the second direction.

As in the above-described example embodiment, the clock signal (CLK_P) and the inverted clock signal (CLK_N) may be provided to the circuit through the gate lines (131 to 133, and 141 to 143). For example, the inverted clock signal (CLK_N) may be applied to the gate line 131, and the clock signal (CLK_P) may be applied to the gate line (132, 133). Further, the inverted clock signal (CLK_N) may be applied to the gate line 141, and the clock signal (CLK_P) may be applied to the gate lines (142, 143).

Figure 10:
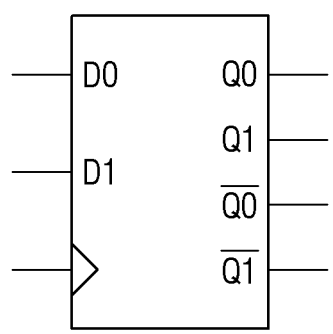
FIG. 10 is an example block diagram of the flip-flop included in the semiconductor device according to some example embodiments of the present disclosure.

FIG. 10 is an example block diagram of the flip-flop included in the semiconductor device according to some example embodiments of the present disclosure.

Referring to FIG. 10, the semiconductor device according to some example embodiments of the present disclosure may include a multi-bit flip-flop.

Specifically, the semiconductor device 20 of FIG. 10 may include a D-flip-flop that receives 2-bit of inputs (D0, D1) to provide 2 bits of outputs (Q0, Q1).

Figure 11:
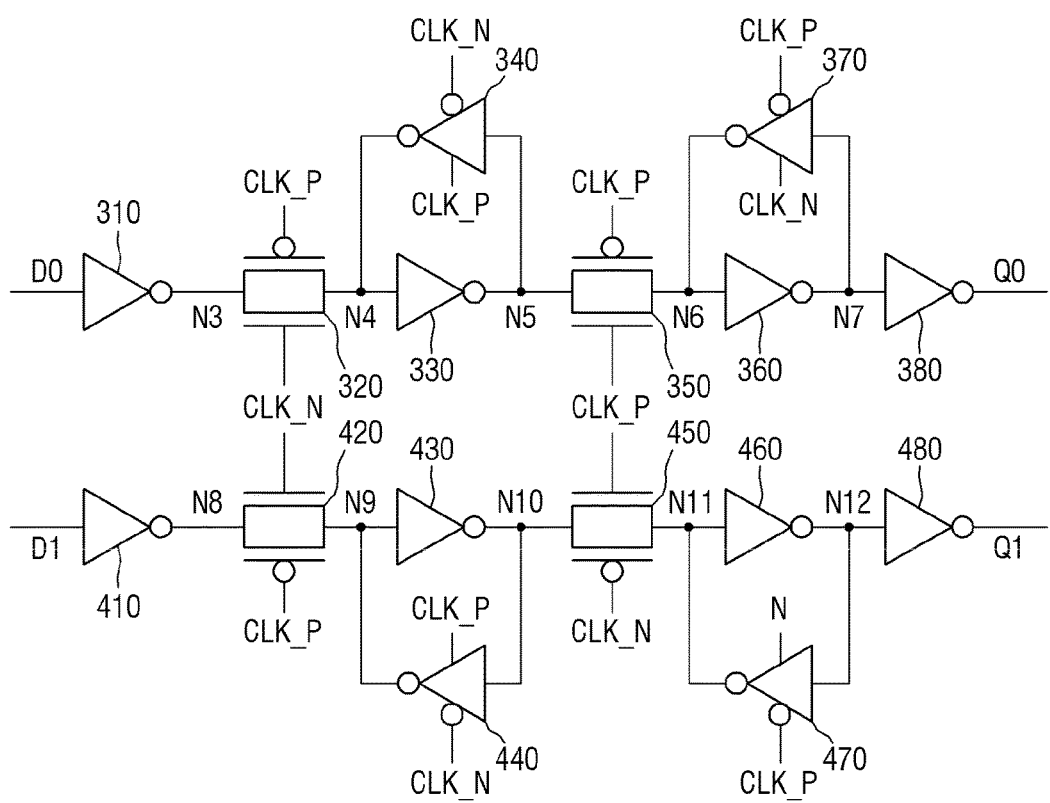
FIG. 11 is an example circuit diagram of the flip-flop included in the semiconductor device according to some example embodiments of the present disclosure.

FIG. 11 is an example circuit diagram of the flip-flop included in the semiconductor device according to some example embodiments of the present disclosure.

Referring to FIG. 11, a flip-flop which is provided with 2 bit of inputs (D0, D1) and provides 2 bit of outputs (Q0, Q1) is illustrated. The respective circuit components illustrated in FIG. 11 are similar to the components of the circuit illustrated in FIG. 6. In other words, similar reference numerals may indicate similar signs.

Figure 12A:
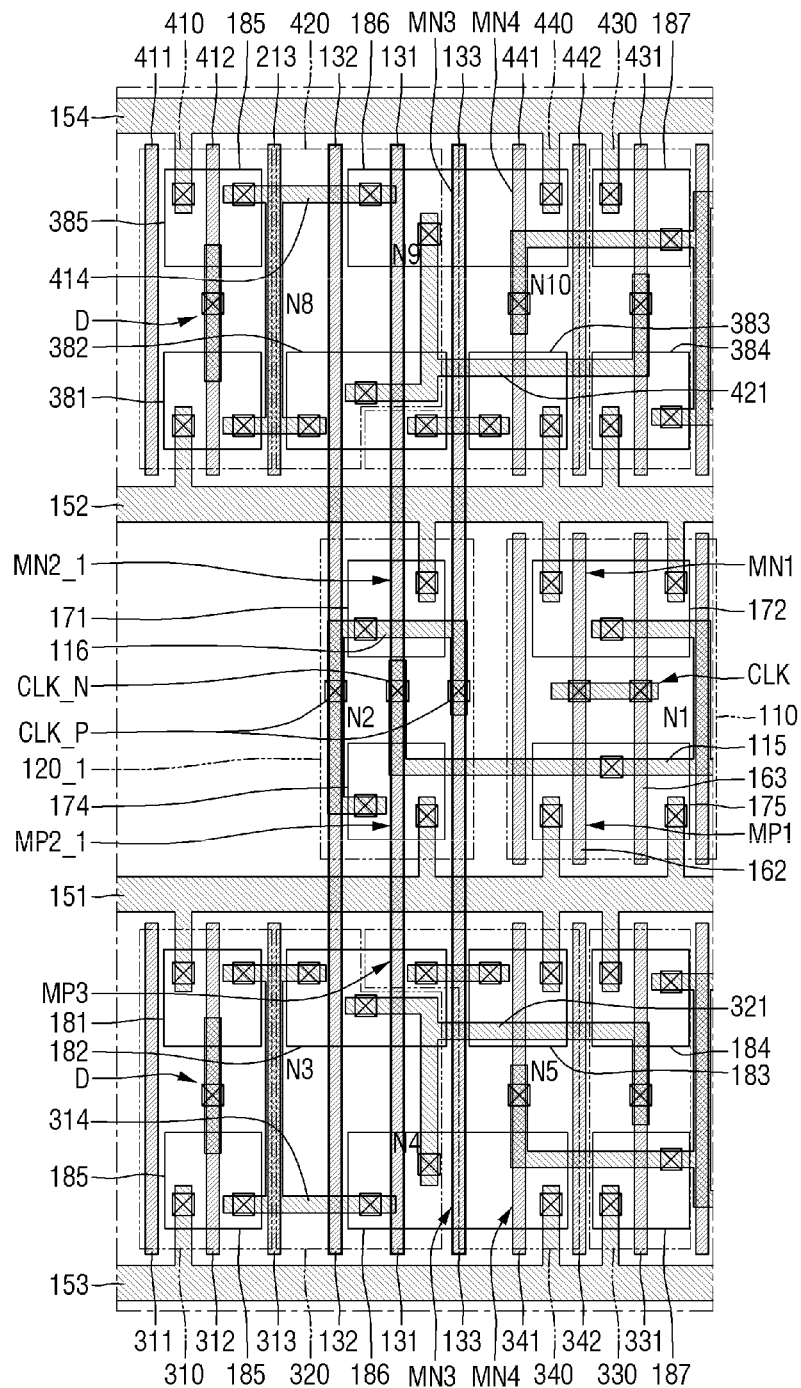
FIGS. 12A and 12B are layout diagrams for explaining the flip-flop circuit of FIG. 11.
Figure 12B:
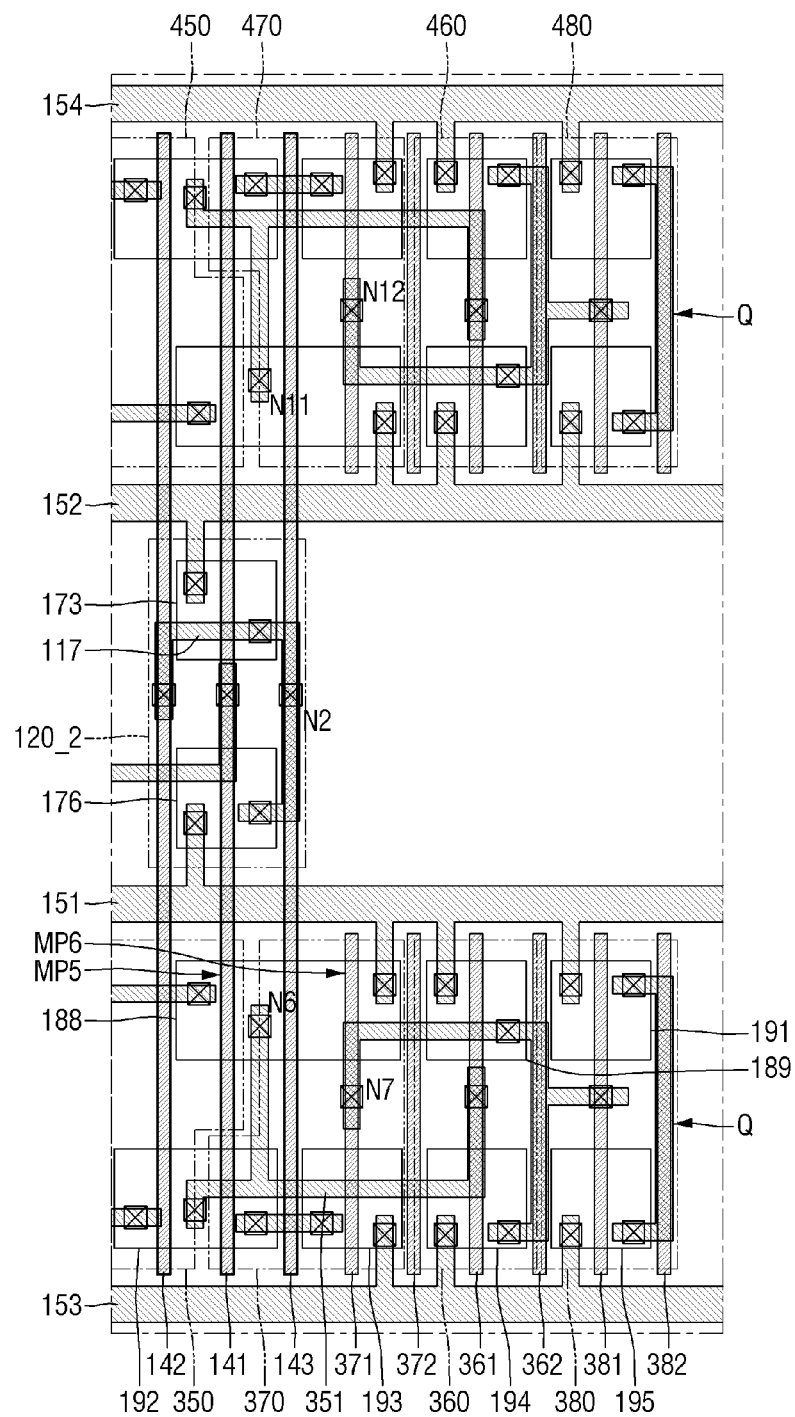

FIGS. 12A and 12B are layout diagrams for explaining the flip-flop circuit of FIG. 11.

Referring to FIGS. 12A and 12B, a part of the flip-flop is illustrated as being arranged on both sides around the central clock driver. For reference, the layouts illustrated in FIGS. 12A and 12B are an example, and the semiconductor device of the present disclosure is not limited by the layout configuration illustrated in FIGS. 12A and 12B.

In the layout illustrated in FIG. 12A, the clock driver provides the clock signal (CLK_P) and the inverted clock signal (CLK_N) to the gate lines (131 to 133). The transmission gates (320, 420), and the first and second master latch tri-state inverters (340, 440) receive the clock signal (CLK_P) from the gate line 131, and receive the inverted clock signal (CLK_N) from the gate lines (132, 133). Therefore, as in the above-described embodiment, each circuit component receives the clock signal (CLK_P) and the inverted clock signal (CLK_N) from the gate lines (131 to 133) rather than the metal.

In the layout illustrated in FIG. 12B, the clock driver provides the clock signal (CLK_P) and the inverted clock signal (CLK_N) to the gate lines (141 to 143). The transmission gates (350, 450), and the first and second slave latch tri-state inverters (370, 470) receive the clock signal (CLK_P) from the gate line 141, and receive the inverted clock signal (CLK_N) from the gate lines (142, 143). Therefore, as in the above-described example embodiment, each circuit component receives the clock signal (CLK_P) and the inverted clock signal (CLK_N) from the gate lines (141 to 143) rather than the metal.

Figure 13:
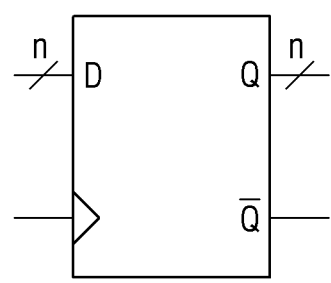
FIG. 13 is an example circuit diagram of the flip-flop included in the semiconductor device according to some example embodiments of the present disclosure.
Figure 14:
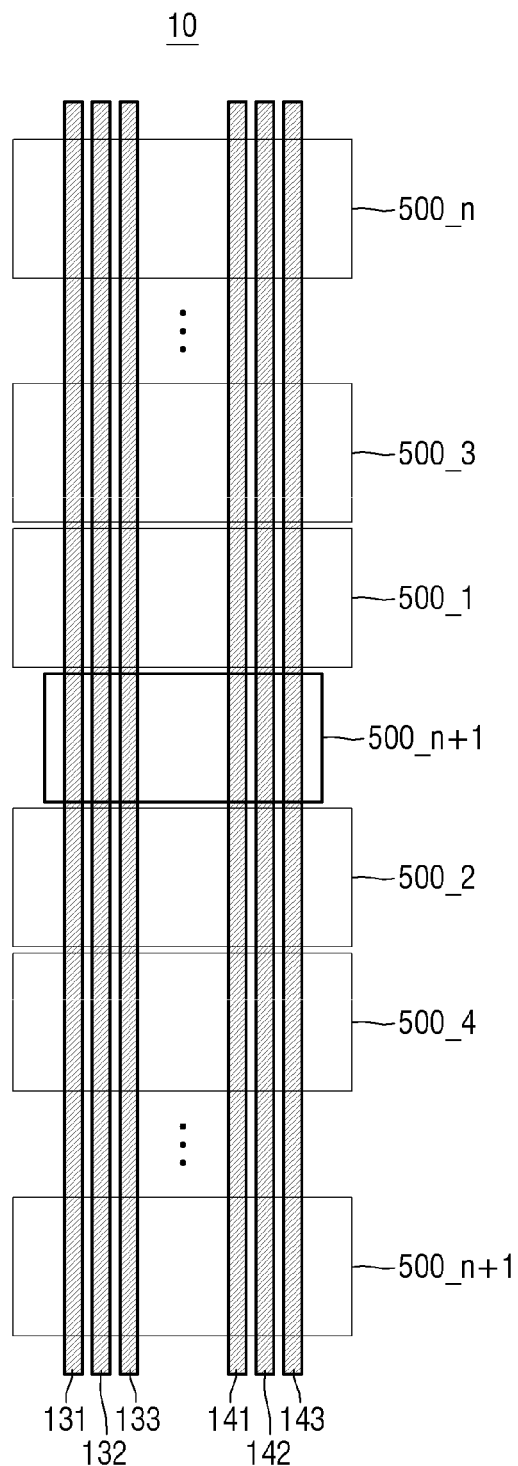
FIG. 14 is a layout diagram for explaining the flip-flop circuit of FIG. 13.

FIG. 13 is an example circuit diagram of the flip-flop included in the semiconductor device according to some example embodiments of the present disclosure, and FIG. 14 is a layout diagram for explaining the flip-flop circuit of FIG. 13.

Referring to FIG. 13, the semiconductor device according to some example embodiments of the present disclosure may include n-bit (n is a natural number of 2 or more) multi-bit flip-flops. The semiconductor device 10 of FIG. 13 may include a D-flip-flop which is provided with an n-bit of input (D) and provides an n-bit of output (Q).

Referring to FIG. 14, an example layout of the n-bit multi-bit flip-flop 10 is illustrated.

The n-bit multi-bit flip-flop 10 may include a clock driver 500 and a plurality of flip-flops (500_1 to 500_n). The plurality of flip-flops (500_1 to 500_n) may include a master latch circuit and a slave latch circuit, which are arranged in order in the first direction, respectively.

The clock signal (CLK_P) and the inverted clock signal (CLK_N) may be provided to the master latch circuit through the gate lines (131 to 133) extending long in the second direction.

The slave latch circuit may receive the clock signal (CLK_P) and the inverted clock signal (CLK_N) through the gate lines (141 to 143) extending long in the second direction.

In FIG. 14, a plurality of flip-flops (500_1 to 500_n) is illustrated as being arranged on both sides of the clock driver 500, but example embodiments of the present disclosure are not limited thereto. The plurality of flip-flops (500_1 to 500_n) may be arranged only on one side of the clock driver 500.

In concluding the detailed description, those skilled in the art will appreciate that many variations and modifications may be made to the example embodiments without substantially departing from the example embodiments of the present disclosure. Therefore, the disclosed example embodiments are used in a generic and descriptive sense only and not for purposes of limitation.

What is claimed is:

1. A semiconductor device comprising:
   a clock driver associated with a first row of the semiconductor device, the clock driver configured to output a clock signal and an inverted clock signal, the clock driver including a plurality of gate lines including a first gate line, a second gate line, a third gate line and a fourth gate line each extending in a first direction such that the plurality of gate lines extend to at least a second row of the semiconductor device, the first gate line and the second gate line each configured to receive the clock signal, and the third gate line and the fourth gate line each configured to receive the inverted clock signal;
   a master latch circuit associated with the second row of the semiconductor device and overlapping the first gate line and the third gate line extending in the first direction thereto such that the master latch circuit is configured to receive the clock signal from the first gate line and to receive the inverted clock signal from the third gate line; and
   a slave latch circuit associated with the second row of the semiconductor device and overlapping the second gate line and the fourth gate line extending in the first direction thereto such that the slave latch circuit is configured to receive the clock signal from the second gate line, and to receive the inverted clock signal from the fourth gate line.

2. The semiconductor device of claim 1, further comprising:
   a first power rail extending in a second direction, the second direction being a different direction from the first direction such that the clock driver, the master latch circuit and the slave latch circuit are each connected to the first power rail.

3. The semiconductor device of claim 2, wherein the first power rail is configured to receive a power supply voltage.

4. The semiconductor device of claim 3, wherein the clock driver further comprises:
   a second power rail extending in the second direction such that the master latch circuit and the slave latch circuit are each connected to the second power rail, the second power rail configured to receive a ground voltage.

5. The semiconductor device of claim 2, wherein the master latch circuit and the slave latch circuit are sequentially arranged in the second direction.

6. The semiconductor device of claim 2, wherein the first direction and the second direction are orthogonal to each other.

7. The semiconductor device of claim 2, wherein the first gate line and the second gate line overlap the first power rail such that the clock driver, the master latch circuit and the slave latch circuit are connected to the first power rail via one or more of the first gate line and the second gate line.

8. The semiconductor device of claim 1, wherein the first gate line includes,
   a first sub-gate line on a first side of the second gate line, and
   a second sub-gate line on a second side of the second gate line.

9. A semiconductor device comprising:
   a clock driver associated with a first row of the semiconductor device, the clock driver configured to output a clock signal and an inverted clock signal, the clock driver including a plurality of gate lines including a first gate line and a second gate line each extending in a first direction such that the plurality of gate lines extend to at least a second row and a third row of the semiconductor device, the first gate line configured to receive the clock signal, and the second gate line configured to receive the inverted clock signal;
a first flip-flop associated with the second row of the semiconductor device such that the first flip-flop is arranged sequentially with the clock driver in the first direction, the first flip-flop configured to receive the clock signal from the first gate line extending in the first direction thereto, and to receive the inverted clock signal from the second gate line extending in the first direction thereto; and
a second flip-flop associated with the third row of the semiconductor device such that the second flip-flop is arranged sequentially with the clock driver in the first direction, the second flip-flop configured to receive the clock signal from the first gate line extending in the first direction thereto, and to receive the inverted clock signal from the second gate line extending in the first direction thereto.

10. The semiconductor device of claim 9, wherein the first flip-flop includes,
a first master latch circuit overlapping the first gate line and the second gate line such that the first master latch circuit is configured to receive the clock signal from the first gate line, and to receive the inverted clock signal from the second gate line; and
a first slave latch circuit overlapping the first gate line and the second gate line such that the first slave latch circuit is configured receive the clock signal from the first gate line, and to receive the inverted clock signal from the second gate line, and
the second flip-flop includes,
a second master latch circuit overlapping the first gate line and the second gate line such that the second master latch circuit is configured to receive the clock signal from the first gate line, and to receive the inverted clock signal from the second gate line; and
a second slave latch circuit overlapping the first gate line and the second gate line such that the second slave latch circuit is configured to receive the clock signal from the first gate line, and to receive the inverted clock signal from the second gate line.

11. The semiconductor device of claim 10, wherein the first master latch circuit and the first slave latch circuit are sequentially arranged in a second direction, and
the second master latch circuit and the second slave latch circuit are arranged sequentially in the second direction, the second direction being orthogonal to the first direction.

12. The semiconductor device of claim 10, wherein the clock driver comprises:
a first power rail and a second power rail, the first power rail and the second power rail each extending in a second direction such that the first power rail and the second power rail are spaced apart from each other in the first direction.

13. The semiconductor device of claim 12, wherein
the first flip-flop and the clock driver are each connected to the first power rail, and
the second flip-flop and the clock driver are each connected to the second power rail.

14. The semiconductor device of claim 13, wherein the first gate line and the second gate line each overlap the first power rail.

15. The semiconductor device of claim 13, wherein the first gate line and the second gate line each overlap the second power rail.

16. The semiconductor device of claim 9, wherein
the first flip-flop is on a first side of the clock driver, and
the second flip-flop is on a second side of the clock driver.

17. The semiconductor device of claim 9, further comprising:
a third gate line crossing the clock driver, the first flip-flop, and the second flip-flop in the first direction, wherein
the first flip-flop and the second flip-flop each are configured to receive at least one of a scan signal, an enable signal, a reset signal, and a set signal from the third gate line.

18. A semiconductor device comprising:
a clock driver configured to output a clock signal and an inverted clock signal;
a first flip-flop on a first side of the clock driver such that the first flip-flop is adjacent to the clock driver in a first direction;
a second flip-flop on a second side of the clock driver such that the second flip-flop is adjacent to the clock driver in the first direction;
a first gate line crossing the clock driver and the first flip-flop in the first direction; and
a second gate line crossing the clock driver and the second flip-flop in the first direction, wherein
the first flip-flop and the clock driver are each connected to a first power rail, and
the second flip-flop and the clock driver are each connected to a second power rail.

19. The semiconductor device of claim 18, wherein
the first gate line is configured to receive the clock signal, and
the second gate line is configured to receive the inverted clock signal.

* * * * *